(12) United States Patent
Panikkath et al.

(10) Patent No.: US 8,718,574 B2
(45) Date of Patent: May 6, 2014

(54) DUTY CYCLE ADJUSTMENT FOR A LOCAL OSCILLATOR SIGNAL

(75) Inventors: Vinod V. Panikkath, San Diego, CA (US); Li Liu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1230 days.

(21) Appl. No.: 12/277,882

(22) Filed: Nov. 25, 2008

(65) Prior Publication Data

US 2010/0130139 A1    May 27, 2010

(51) Int. Cl.
*H04B 1/40* (2006.01)

(52) U.S. Cl.
USPC ............................................. 455/86

(58) Field of Classification Search
CPC ............ H04B 1/406; H04B 1/28; H03L 7/18
USPC ........................ 455/75, 76, 85, 86; 331/74, 45
See application file for complete search history.

(56) References Cited

U.S. PATENT DOCUMENTS

| | | |
|---|---|---|
| 4,061,882 A | 12/1977 | Dorren |
| 4,333,020 A | 6/1982 | Maeder |
| 4,555,777 A | 11/1985 | Poteet |
| 4,623,801 A | 11/1986 | Rocchi |
| 4,716,320 A | 12/1987 | McAdams |
| 4,959,557 A | 9/1990 | Miller |
| 4,995,589 A | 2/1991 | Adishian et al. |
| 5,097,157 A | 3/1992 | Jaffe et al. |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |
| 5,375,258 A | 12/1994 | Gillig |
| 5,477,180 A | 12/1995 | Chen |
| 5,534,803 A | 7/1996 | Correale, Jr. et al. |
| 5,682,109 A | 10/1997 | Ohmi et al. |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |

(Continued)

FOREIGN PATENT DOCUMENTS

| CN | 1412947 A | 4/2003 |
|---|---|---|
| EP | 0398751 A2 | 11/1990 |

(Continued)

OTHER PUBLICATIONS

International Search Report and Written Opinion—PCT/US2009/065961, International Search Authority—European Patent Office—Feb. 17, 2010.

(Continued)

*Primary Examiner* — Sibin Chen
(74) *Attorney, Agent, or Firm* — S. Hossain Beladi (57) ABSTRACT

A local oscillator (LO) module comprises a local oscillator and a feedback circuit. The local oscillator, biased at a supply voltage, generates a local oscillator signal having a duty cycle. The feedback circuit makes an absolute adjustment of the duty cycle of the local oscillator signal in response to a difference between a first voltage signal, representing a voltage level of the local oscillator signal, and a second voltage signal, representing a voltage level of a portion of the supply voltage corresponding to a desired duty cycle for the local oscillator signal.

13 Claims, 4 Drawing Sheets

(56) References Cited

U.S. PATENT DOCUMENTS

| | | |
|---|---|---|
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 * | 1/2009 | Ni et al. ............ 375/330 |
| 7,521,976 B1 | 4/2009 | Sudjian et al. |
| 7,554,380 B2 | 6/2009 | Embabi et al. |
| 7,580,483 B2 * | 8/2009 | Ibrahim et al. ............ 375/326 |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 | 7/2010 | Gschier |
| 7,750,749 B2 | 7/2010 | Jones |
| 7,768,330 B2 | 8/2010 | Yuuki et al. |
| 7,808,329 B2 * | 10/2010 | Azadet et al. ............ 331/57 |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,248,132 B2 | 8/2012 | Chang |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 * | 3/2004 | Juntunen et al. ............ 307/130 |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0273485 A1 * | 11/2007 | Balachandran et al. ... 340/10.34 |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 * | 9/2008 | Takita et al. ............ 348/554 |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0194485 A1 | 8/2010 | Chawla et al. |
| 2010/0198540 A1 | 8/2010 | Yanagisawa et al. |
| 2010/0226459 A1 | 9/2010 | Park et al. |
| 2011/0001522 A1 | 1/2011 | Chan et al. |
| 2011/0012648 A1 | 1/2011 | Qiao et al. |
| 2011/0043291 A1 | 2/2011 | Fagg |
| 2011/0050296 A1 | 3/2011 | Fagg |
| 2011/0181330 A1 | 7/2011 | Oh |
| 2012/0187994 A1 | 7/2012 | Yang et al. |
| 2013/0012150 A1 | 1/2013 | Panikkath et al. |
| 2013/0271188 A1 | 10/2013 | Chan |

FOREIGN PATENT DOCUMENTS

| | | |
|---|---|---|
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |
| JP | 2058951 A | 2/1990 |
| JP | 2060330 U | 5/1990 |
| JP | 2131615 A | 5/1990 |
| JP | H03262317 A | 11/1991 |
| JP | 5268000 A | 10/1993 |
| JP | 7170162 A | 7/1995 |
| JP | 9046195 A | 2/1997 |
| JP | 9191238 A | 7/1997 |
| JP | 10111674 A | 4/1998 |
| JP | 10247842 A | 9/1998 |
| JP | 2000332583 A | 11/2000 |
| JP | 2001245007 A | 9/2001 |

(56) References Cited

FOREIGN PATENT DOCUMENTS

| | | |
|---|---|---|
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004531126 A | 10/2004 |
| JP | 2004336822 A | 11/2004 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| JP | 2010539819 A | 12/2010 |
| KR | 2005110080 A | 4/2005 |
| KR | 20050055925 A | 6/2005 |
| KR | 20080019156 A | 3/2008 |
| TW | 200529566 | 9/2005 |
| TW | 200723676 | 6/2007 |
| TW | 1283515 B | 7/2007 |
| WO | WO9621270 A1 | 7/1996 |
| WO | WO9912259 A2 | 3/1999 |
| WO | WO0129965 A1 | 4/2001 |
| WO | WO0251091 A1 | 6/2002 |
| WO | 02052691 A1 | 7/2002 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-p. 279.

Jun. 17, 2008, pp. 277-280, XP031284334 ISBN: 978-1-4244-1808-4 * Section 111. Detailed Description*; pp. 277-279.

Taiwan Search Report—TW098140250—TIPO—Oct. 9, 2012.

Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.

Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY: IEEE, US, Oct. 2, 2000, p. 106/107, XP001003452, ISBN: 978-0-7803-6390-8 p. 106; figure 3.

Taiwan Search Report—TW097149468—TIPO—Mar. 21, 2012.

Chan, et al., "Hercules (RTR9800) Divider", Aug. 2005.

Chan, "Hercules (RTR8700) Divider", Aug. 2005.

Co-pending U.S. Appl. No. 13/011,716, filed Jan. 21, 2011.

Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA, IEEE, US, May 5, 1997, pp. 411-414, XP010235334, DOI: 10.1109/CICC.1997.606656 ISBN: 978-0-7803-3669-8.

* cited by examiner

DUTY CYCLE ADJUSTMENT FOR A LOCAL OSCILLATOR SIGNAL

FIELD OF THE INVENTION

The present invention generally relates to radio frequency (RF) communications. More particularly, the present invention relates to adjusting a duty cycle of a local oscillator signal employed in a RF communications.

BACKGROUND OF THE INVENTION

In radio frequency (RF) communication applications, a RF receiver or a receiver portion of an RF transceiver is an electronic circuit that receives an input from an antenna, and uses electronic filters to separate a radio signal of interest from all other radio signals received by the antenna. An amplifier amplifies the radio signal of interest to a level suitable level for processing. A local oscillator generates a local oscillator signal for a mixer to convert the amplified the radio signal of interest to a different frequency. The converted frequency signal is further filtered, amplified, demodulated, and decoded into a usable form, such as sound, pictures, digital data, measurement values, navigational positions, etc.

A RF receiver may be required to tolerate the presence of large interfering signals lying within a pass-band that corresponds to a communication channel of interest. These interfering signals may have originated from users in adjacent channels and/or from transmission sources which may be relatively far removed in frequency from the channel of interest but whose large transmission power may still cause significant interference problems. These interfering signals may be referred to as blockers and their relative frequency and/or detected power to that of the desired signal may vary based on transmission scheme and/or operational conditions. The effect of interfering signals in the channel of interest may result in, for example, bit error rate (BER) degradation in digital RF systems and audible and/or visible signal-to-noise ratio (SNR) degradation in analog RF systems.

The ability to provide an interference-tolerant RF receiver design may be difficult to accomplish as second-order and/or third-order distortion effects are increasingly becoming a limitation in circuitry utilized by the wireless receivers. For example, mixers and/or other circuitry which may be employed to down-convert a frequency signal of interest to a zero intermediate frequency (IF) signal or to a low IF signal may generate, as a result of second-order and/or third-order nonlinearities, spectral components from blocker signals, which may be at or near direct current (DC). An effect of these spectral components may be to introduce a DC offset to the desired signals at the zero IF which may result in signal saturation or, as mentioned above, a noticeable degradation to the system's noise performance, such as represented by noise figure.

The concepts of linearity and noise figure are well known to those skilled in the art of RF receiver design. The second-order and/or third-order nonlinearities are typically represented by second and third intercept points (IP2 and IP3). Noise figure (NF) is a measure of degradation of signal to noise ratio (SNR), caused by components in the RF receiver. The noise figure is a ratio of an output noise power of a RF receiver to a portion thereof attributable to thermal noise in the input termination at standard noise temperature $T_0$ (usually 290 degrees Kelvin). Thus, the noise figure is the ratio of actual output noise to that which would remain if the RF receiver itself did not introduce noise.

A duty cycle of the local oscillator signal affects the noise figure and the linearity (e.g., IP2) of the RF receiver. Traditionally, IP2 calibration of a RF receiver is performed by adjusting a mixer bias voltage in a manufacturing environment using test equipment to improve the linearity of the RF receiver.

Further limitations and disadvantages of conventional and traditional approaches will become apparent to one of skill in the art of RF receiver designs, through comparison of such systems with some aspects of the present invention, as set forth in the remainder of the present application with reference to the drawings.

SUMMARY OF THE INVENTION

According to one aspect of the present invention, a local oscillator (LO) module comprises a local oscillator and a feedback circuit. The local oscillator, biased at a supply voltage, generates a local oscillator signal having a duty cycle. The feedback circuit makes an absolute adjustment of the duty cycle of the local oscillator signal in response to a difference between a first voltage signal, representing a voltage level of the local oscillator signal, and a second voltage signal, representing a voltage level of a portion of the supply voltage corresponding to a desired duty cycle for the local oscillator signal.

According to other aspects of the present invention, the present invention employs an apparatus, a method, a system, and a computer readable memory.

These and other aspects of the present invention will be apparent from the accompanying drawings and from the following detailed description.

BRIEF DESCRIPTION OF THE DRAWINGS

Aspects of the present invention are illustrated by way of examples and not limitation in the figures of the accompanying drawings, in which like reference numbers designate corresponding elements.

DETAILED DESCRIPTION OF THE EMBODIMENTS

The following description and drawings are illustrative of aspects and examples of the invention and are not to be construed as limiting the invention. Numerous specific details are described to provide a thorough understanding of the present invention. However, in certain instances, well-known or conventional details are not described in order to avoid obscuring the description of the present invention. References to one embodiment or an embodiment in the present disclosure are not necessarily to the same embodiment, and such references may include one or more embodiments.

Figure 1:
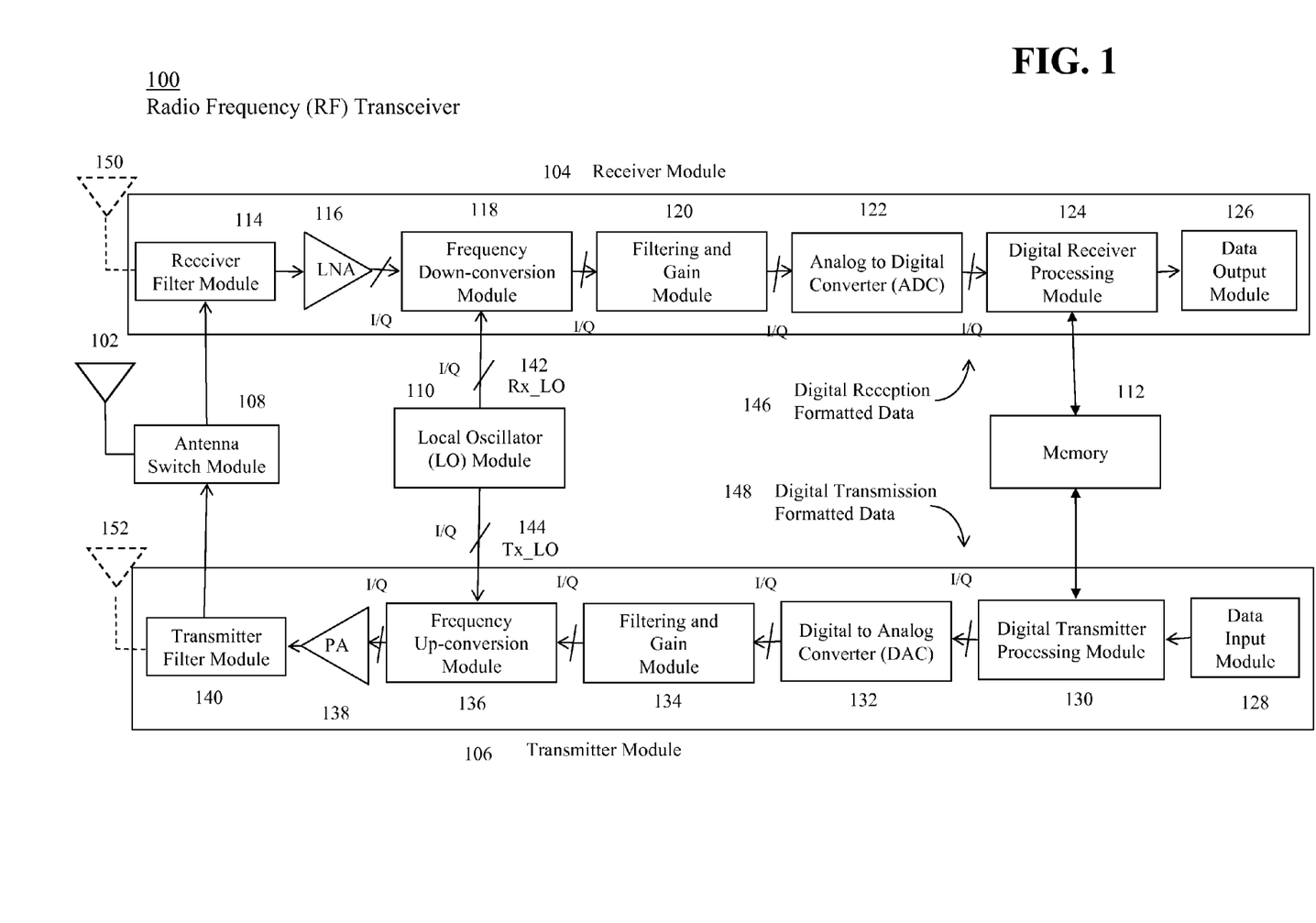
FIG. 1 illustrates a block diagram representation of a radio frequency (RF) transceiver, according to one aspect of the present invention.

FIG. 1 illustrates a block diagram representation of a radio frequency (RF) transceiver 100, according to one aspect of the present invention. The RF transceiver 100 includes an antenna 102, a receiver module 104, a transmitter module 106, an antenna switch module 108, a local oscillator (LO) module 110, and a memory 112. In practice, not every RF transceiver design will have all of the elements shown in FIG. 1, nor does the RF transceiver 100, shown in FIG. 1, convey the complexity of other RF transceiver designs.

The receiver module 104 further includes a receiver filter module 114, a low noise amplifier (LNA) 116, a frequency down-conversion module 118, a filtering and gain module 120, an analog to digital converter (ADC) 122, a digital receiver processing module 124, and a data output module 126. In the receiver module 104, digital reception formatted data is provided at the output of the ADC 122, as is well known to those skilled in the art of digital RF transceiver design.

The transmitter module 106 further includes a data input module 128, a digital transmitter processing module 130, a digital to analog converter (DAC) 132, a filtering and gain module 134, a frequency up-conversion module 136, a power amplifier (PA) 138, and a transmitter filter module 140. In the transmitter module 106, digital transmission formatted data is provided at the input of the DAC 132, as is well known to those skilled in the art of digital RF transceiver design.

The antenna switch module 108 permits a single antenna 102 to switch between the receiver module 104 and the transmitter module 106. Alternatively, an antenna 150 and an antenna 152 may be directly coupled to the receiver module 104 and the transmitter module 106, respectively, thereby permitting the single antenna 102 and the antenna switch module 108 to be eliminated, as is well known to those skilled in the art of RF transceiver design.

The LO module 110 generates one or more LO signals for the receiver module 104 and the transmitter module 106, and includes a Rx LO module and a Tx LO module for generating the Rx LO signal 142 and the Tx LO signal 144, respectively.

Each of the receiver module 104, the transmitter module 106, and the LO module 110 may process, provide, or generate one or more pairs of digital signals, such as in-phase ("I") and quadrature-phase (Q) signals, as is well known to those skilled in the art of digital RF transceiver design.

The memory 112 provides a source and/or destination of stored instructions and/or data for used by the receiver module 104 and the transmitter module 106, as is well known to those skilled in the art of RF transceiver design.

The design, function and/or purpose of each individual element or block shown in the RF transceiver 100 and the interconnections between such elements or blocks in the RF transceiver 100 are well known to those skilled in the art of RF transceiver design.

Aspects of the present invention relate to the LO module 110 and in particular, the LO signal(s) (Rx LO) 142 generated by the LO module 110 for use by the receiver module 104.

In general, the LO module 110 produces a signal at a frequency close to the frequency of a signal being received and detected by the receiver module 104. Typically, one or more mixers in the frequency down-conversion module 118 mix the LO signal(s) (Rx LO) 142 generated by the LO module 110 with the received signal present at the output of the LNA 116 to typically provide one or more mixed signals at the output of the frequency down-conversion module 118.

The RF transceiver 100 may be employed in a communication system, such as a global navigation satellite system (GNSS) (not shown), a cellular system (not shown), a landline telephone system (not shown), as is well known to those skilled in the art of designing RF transceivers and communication systems. The communication system provides wireless communications for a mobile station, and is not limited to cellular, fixed wireless, PCS, or satellite communications systems.

The cellular system typically includes multiple cellular base stations ("base station" or "BS") (not shown), a mobile switching center (not shown), and a location server (not shown), which is otherwise called a position determining entity (PDE). The cellular system may provide for multiple access communications, in accordance with any standard or protocol, such as, for example, CDMA, TDMA, FDMA, or GSM, or combinations thereof. The RF transceiver 100 may be employed in a base station of a cellular system.

The RF transceiver 100 may be employed as or in a cellular mobile station ("mobile station" or "MS"). The transmitter module 106 transmits communication signals to a BS receiver (not shown). The receiver module 104 receives communication signals from a BS transmitter (not shown).

The mobile station may be fixed (i.e., stationary) and/or mobile (i.e., portable). The mobile station may be implemented in a variety of forms including, but not limited to, one or more of the following: a personal computer (PC), a desktop computer, a laptop computer, a workstation, a minicomputer, a mainframe, a supercomputer, a network-based device, a data processor, a personal digital assistant (PDA), a smart card, a cellular telephone, a pager, and a wristwatch.

Figure 2:
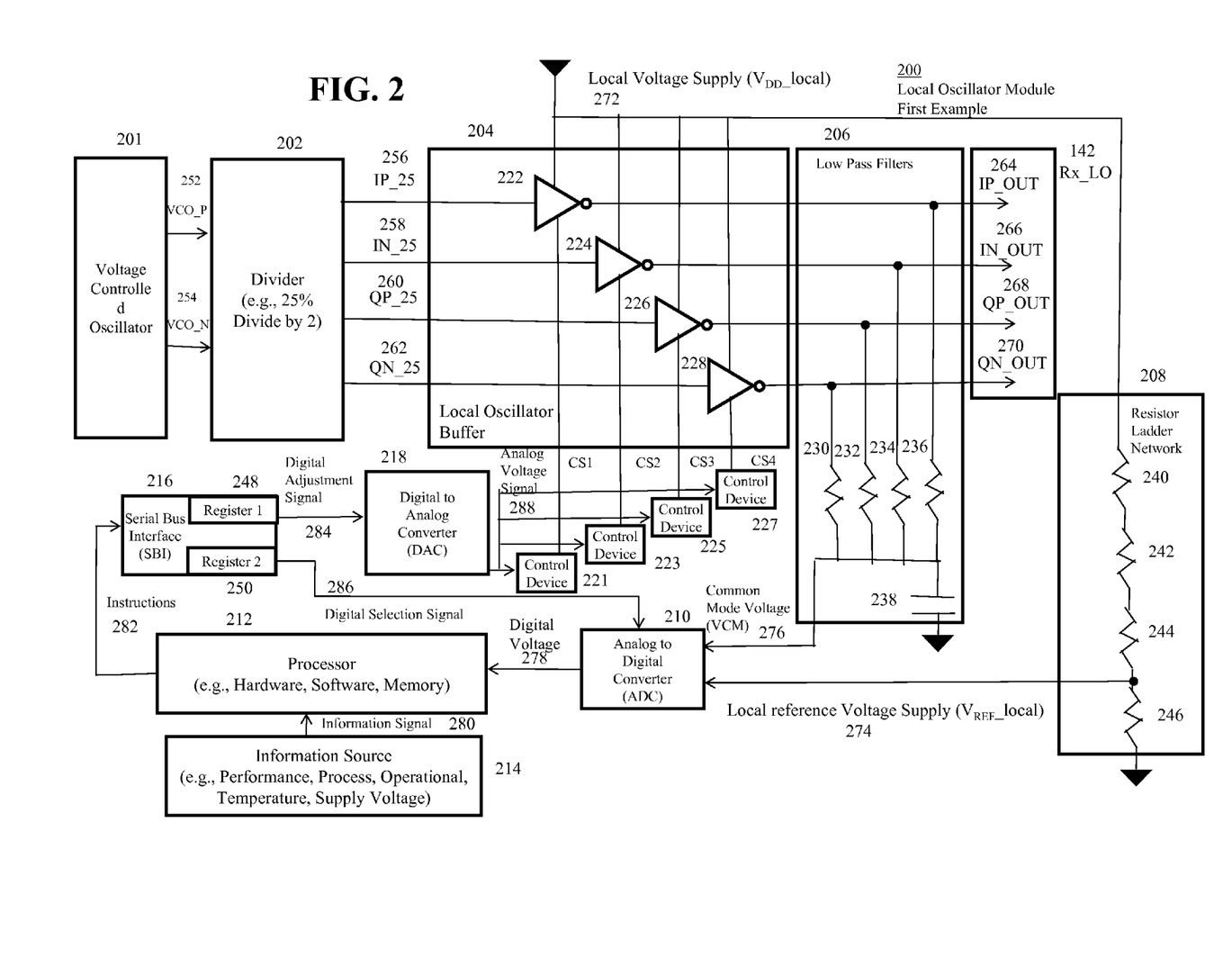
FIG. 2 illustrates a first example of a block diagram representation of a local oscillator (LO) module which may be used in the RF transceiver, shown in FIG. 1, according to one aspect of the present invention.

FIG. 2 illustrates a first example of a block diagram representation of a local oscillator (LO) module 200 which may be used in the RF transceiver, shown in FIG. 1, according to one aspect of the present invention. The LO module 200 includes a voltage controlled oscillator (VCO) 201, a divider 202, a local oscillator (LO) buffer 204, low pass filters 206, a resistor ladder network 208, an analog to digital converter (ADC) 210, a processor 212, an information source 214, a serial bus interface (SBI) 216, a digital to analog converter (DAC) 218, and control devices 221, 223, 225, and 227.

The VCO generates a positive and a negative VCO signals represented as VCO_P 252 and VCO_N 254, respectively, as is well known to those skilled in the art of VCO design.

The divider divides the positive and negative VCO signals 252 and 254, as is well known to those skilled in the art of divider designs. The divider may divide by any number such as, for example, divide by two, and have any duty cycle, such as, for example, a 25% duty cycle, thereby generating four divided signals, represented as IP_25 256, IN_25 258, QP_25 260, and QN_25 262.

The LO buffer 204 further includes buffers 222, 224, 226, and 228. The four LO buffers 222, 224, 226, and 228 receive and buffer the four divided signals, represented as IP_25 256, IN_25 258, QP_25 260, and QN_25 262, respectively, to generate four LO output signals, represented as IP_OUT 264, IN_OUT 266, QP_OUT 268, and QN_OUT 270, respectively. The number of LO buffers typically corresponds to the number of divider signals received from the divider 202, wherein each buffer receives and buffers one divided signal, which is four in the example in FIG. 2. The four LO output signals, represented as IP_OUT 264, IN_OUT 266, QP_OUT 268, and QN_OUT 270, together generally represent the LO signal, Rx LO 142, shown in the RF transceiver 100 in FIG. 1, and operate with the frequency down-conversion module 118, as is well known to those skilled in the art of RF transceiver designs.

Each of the four LO buffers 222, 224, 226, and 228 also receive a local voltage supply (VDD_local) 272 to provide a bias voltage for each of the four LO buffers. The local voltage supply (VDD_local) 272 is a supply voltage local to the LO module 200, and typically not local to another function elsewhere in the RF transceiver 100 to provide the most advantageous effect for the LO module 200. In one example, the local voltage supply (VDD_local) 272 is 1.3 V±5%, including a voltage range of 1.25 V to 1.35 V.

The four LO buffers 222, 224, 226, and 228 also receive control signals CS1, CS2, CS3, and CS4 for controlling the corresponding four LO buffers 222, 224, 226, and 228, as will be described further herein below. According to aspects of the present invention, the pulse width of each of the four LO output signals, represented as IP_OUT 264, IN_OUT 266, QP_OUT 268, and QN_OUT 270, are adjusted in response to receiving the control signals CS1, CS2, CS3, and CS4, as will be described further herein below.

The low pass filters 206 further include resistors 230, 232, 234, and 236 when used individually in combination with capacitor 238, as are individually well known to those skilled in the art of filter design. The low pass filter represented by resistor 230 and capacitor 238 determines an average voltage level of the buffer output signal, represented by QN_OUT 270. The low pass filter represented by resistor 232 and capacitor 238 determines an average voltage level of the buffer output signal, represented by QP_OUT 268. The low pass filter represented by resistor 234 and capacitor 238 determines an average voltage level of the buffer output signal, represented by IN_OUT 266. The low pass filter represented by resistor 236 and capacitor 238 determines an average voltage level of the buffer output signal, represented by IP_OUT 264. The voltage level of each buffer output signal is an average of the signal being high and low over one period. For example, for an LO signal with a 25% duty cycle, the voltage is high (e.g., 1.3V) for 25% of the time period and low (e.g., 0V) for 75% of the time period. Thus, in this example, the average voltage level for each buffer output signal is about 0.325V (i.e., 1.3V×0.25).

The output of the low pass filters 206 is a common mode voltage (VCM) signal 276, representing an average voltage level of all of the average voltage levels of the four low pass filters, because the four resistors 230, 232, 234, and 236 are each connected to the same terminal on the capacitor 238. In other words, the VCM signal 276 is an average voltage level, represented by the average voltage levels of the four LO output signals, represented as IP_OUT 264, IN_OUT 266, QP_OUT 268, and QN_OUT 270, added together and divided by four. Under ideal circumstances, in the example where the local voltage supply (VDD_local) 272 is 1.3 V±5%, or 1.25 V to 1.35 V, the VCM signal 276 may be about 0.325 V (i.e., 1.3 V divided by 4) when the duty cycle of the LO output signals is twenty five percent (25%). However, because circumstances are not typically ideal, in this example, the VCM signal 276 may vary between about 0.3125 V and 0.3375 V, for example. Other circuits or methods for determining the voltage level of the LO output signals may be used instead of the low pass filters 206.

The resistor ladder network 208 further includes resistors 240, 242, 244, and 246. The top of the resistor ladder network 208 is coupled to the local voltage supply (VDD_local) 272, which provides bias voltage for each of the four LO buffers 222, 224, 226, and 228. The bottom of the resistor ladder network 208 is coupled to a ground potential. A local reference voltage supply signal (VREF_local) 274 is tapped off of the resistor ladder network 208 between resistor 244 and 246. In an example of the resistor ladder network 208, shown in FIG. 2, each of the resistors 240, 242, 244, and 246 have substantially the same resistive value. In this example, for a LO signal with a 25% duty cycle, the local reference voltage supply signal (VREF_local) 274 represents about one fourth or one quarter of the local voltage supply (VDD_local) 272. Under ideal circumstances, in the example where the local voltage supply (VDD_local) 272 is 1.3 V±5%, or 1.25 V to 1.35 V, the local reference voltage supply signal (VREF_local) 274 may be about 0.325 V (i.e., 1.3 V divided by 4). In another example, for a LO signal with a 50% duty cycle, when VREF_local 274 is tapped off of the resistor ladder network 208 between resistor 242 and 244, the VREF_local 274 represents about one half of the local voltage supply (VDD_local) 272. Hence, the determined voltage level of portion of the local voltage supply 272 corresponds to a desired duty cycle of the local oscillator signals. Other circuits or methods for determining a fraction or portion of the local reference voltage supply signal (VREF_local) 274 may be used instead of the resistor ladder network 208.

The ADC 210 receives at the VCM signal 276 and the local reference voltage supply signal (VREF_local) 274 and generates a digital voltage signal 278. The ADC 210 may be referred to as a housekeeping ADC or a HKADC when the ADC 210 performs ADC functions for one or more purposes in the LO module 200 and/or the RF transceiver 100. In one example, the ADC 210 may employ ten (10) bits for converting the VCM signal 276 and the local reference voltage supply signal (VREF_local) 274 from an analog signal to a digital signal. In one example, the ADC 210 may employ a switch function for selectively receiving either the VCM signal 276 or the local reference voltage supply signal (VREF_local) 274 in response to a digital selection signal 286, to provide the selected signal to the processor 212. Other circuits or methods for converting, switching between, or providing the VCM signal 276 or the local reference voltage supply signal (VREF_local) 274 may be used instead of the ADC 210.

The processor 212 receives each of the VCM signal 276 and the local reference voltage supply signal (VREF_local) 274. The processor 212 compares the VCM signal 276 and the local reference voltage supply signal (VREF_local) 274. The processor 212 may store, in memory, each of the received VCM signal 276 and the received local reference voltage supply signal (VREF_local) 274, if received one at a time from the ADC 210, or may compare, without storing in memory, the received VCM signal 276 and the received local reference voltage supply signal (VREF_local) 274, if received from two separate ADCs, for example.

The processor 212 determines a difference, if any, between the VCM signal 276 and the local reference voltage supply signal (VREF_local) 274. Under ideal circumstances, the VCM signal 276 and the local reference voltage supply signal (VREF_local) 274 should be the same because, in the present example, an average voltage level for each one of the four LO buffer output signals 264, 266, 268, and 270, and the average voltage level of all four buffer output signals 264, 266, 268, and 270, should be equal to one fourth of the local voltage supply (VDD_local) 272. This should be the case because, in this example, when the LO signal has a 25% duty cycle, the VCM signal 276 should be equal to one fourth (¼) of the local voltage supply (VDD_local) 272. In another example, when the LO signal has a 50% duty cycle, the VCM signal 276 should be equal to one half (½) of the local voltage supply (VDD_local) 272.

Ideal circumstance do not always exist, however, which causes a pulse width of one or more of the four LO buffer output signals 264, 266, 268, and 270 to vary, thereby causing a corresponding duty cycle of one or more of the four LO buffer output signals 264, 266, 268, and 270 to vary. Such variation in the duty cycle of the LO signal, represented by Rx LO 142 in FIG. 1, may have a detrimental effect on performance parameters, such as noise figure and linearity, in the RF transceiver 100 in FIG. 1. Intelligent and accurate control of the duty cycle of the LO signal, under non-ideal conditions, such as, for example, integrated circuit process, supply voltage range, and temperature (i.e., PVT), would permit the RF transceiver 100 to operate the LO signal at a desirable duty cycle that would achieve a desirable balance of performance parameters in the RF transceiver 100 in FIG. 1.

To achieve intelligent and accurate control of the duty cycle of the LO signal, the processor adjusts (i.e., modifies, changes, shifts, etc.) the pulse width of the LO signal in an effort to minimize the difference, if any, between the VCM signal 276 and the local reference voltage supply signal (VREF_local) 274. In other words, the processor 212 adjusts the pulse width of the LO signal to steer (i.e., direct, tune, modify, etc.) the voltage difference between the two signals to zero voltage difference. A zero voltage difference would represent that the average voltage level of the four LO signals 264, 266, 268, and 270 is the same as one fourth (or one half for an LO signal with a 50% duty cycle, for example) of the voltage level of the local voltage supply (VDD_local) 272.

The processor 212 adjusts the pulse width of the LO signal in response to one or more inputs from the information source 214. Such inputs may include things that cause the non-ideal conditions, such as, for example, integrated circuit process (e.g., CMOS), supply voltage range, temperature, operational parameters (e.g., frequency channel band), performance parameters (e.g., fast or slow chip), etc. Such inputs maybe determined statically or dynamically. Static inputs may include, for example, data measurements, determinations, or summaries thereof, of multiple integrated circuits in a lab, which are stored in the memory 112 of the RF transceiver 100, the receiver module 104, or LO module 110, shown in FIG. 1. In other words, static inputs are determined before the RF transceiver 100 is manufactured. Dynamic inputs may include, for example, data measurements of determinations made after the RF transceiver 100, the receiver module 104, or LO module 110 is manufactured and is operational. The dynamic inputs may be determined at any time, such as, for example, real time, periodically in time, at a particular operational time, such as changing frequency bands, or at power up, etc., when an input value changes, etc.

The processor 212 performs the adjustment using a binary search algorithm (i.e., process or method), for example, in software (i.e., programmable instructions stored in memory). Binary search algorithms are well know to those skilled in the art of making software adjustments, and involve starting in the middle of a data set, then determining whether to move half way up or down, and then determining whether to move one quarter of the way up or down, then determining whether to move one eighth of the way up or down, etc., until a reasonable determination is made in maybe five to six steps (e.g., for a 128 bit data set: 64, 32, 16, 8, 4, 2). Binary search algorithms advantageously permit a rapid determination to be made. Other circuits or methods for performing the adjustment may be used, instead of the binary search algorithm.

The SBI 216 further includes many registers including register one 248 and register two 250. The processor 212 provides the pulse width adjustment to the SBI 216 in the form of instructions 282, for example. The processor 212 also provides instructions 282, for example, to the SBI 216 for controlling the digital selection signal 286, described herein above. The SBI 216 receives the instructions for the pulse width adjustment and the ADC 210, and controls register one 248 and register two 250, respectively, to provide a digital adjustment signal 284 and the digital selection signal 286, respectively. The operation and design of the SBI, individually, is well known to those in the art of interface communications. Other circuits or methods for providing the digital adjustment signal 284 and the digital selection signal 286 may be used, instead of the SBI 216.

The DAC 218 converts the digital adjustment signal 284 from a digital signal to an analog signal to provide an analog voltage signal 288. In one example, the DAC 218 may have six bits. The analog voltage signal 288 provides analog or continuous feedback control of the local oscillator buffers 222, 224, 226, 228.

Each of the control devices 221, 223, 225, and 227, which may be represented, for example, as an N-type field effect transistor (FET) or a P-type FET, receives the same analog voltage signal 288 and provide a control signals CS1, CS2, CS3, and CS4, respectively. The analog voltage signal 288 adjusts the amount of current drained from the local voltage supply 272, through each buffer 222, 224, 226, and 228, and through each corresponding control device 221, 223, 225, and 227 to a ground voltage potential (not shown inside the control devices). Varying the current through each buffer 222, 224, 226, and 228 varies the slew rate of each of the four LO output signals 264, 266, 268, and 270. Thus, control devices 221, 223, 225, and 227 provide the control signals CS1, CS2, CS3, and CS4, respectively, to each of the LO buffers 222, 224, 226, and 228, respectively, to adjust a slew rate of each of the four LO output signals 264, 266, 268, and 270, respectively, which, in turn, adjusts the pulse width of each of the four LO output signals 264, 266, 268, and 270, respectively.

A slew rate of a signal represents a maximum rate of change of a signal (e.g., the slope of a signal pulse) at any point in a circuit. Limitations in slew rate can give rise to non linear effects in electronic circuits. Adjusting the pulse width of each of the four LO output signals 264, 266, 268, and 270 permits adjustment of the duty cycle of each of the corresponding four LO output signals 264, 266, 268, and 270. Therefore, intelligent and accurate control of the duty cycle of the four LO output signals 264, 266, 268, and 270, under non-ideal conditions, such as, for example, integrated circuit process, supply voltage range, and temperature (i.e., PVT), advantageously permit the RF transceiver 100 to operate the four LO output signals 264, 266, 268, and 270 at a desirable duty cycle that achieve a desirables balance of performance parameters (e.g., linearity and noise figure) in the RF transceiver 100 in FIG. 1. Other circuits or methods for providing the control signals CS1, CS2, CS3, and CS4 may be used, instead of control devices 221, 223, 225, and 227, respectively.

Further, the control signals CS1, CS2, CS3, and CS4 may be applied directly or indirectly in the feedback loop to adjust the pulse width of each of the four LO output signals 264, 266, 268, and 270, respectively. The control signals CS1, CS2, CS3, and CS4 directly adjust the pulse width of each of the four LO output signals 264, 266, 268, and 270, respectively, by being applied to the LO buffers 222, 224, 226, and 228, respectively. The control signals CS1, CS2, CS3, and CS4 indirectly adjust the pulse width of each of the four LO output signals 264, 266, 268, and 270, respectively, by being applied to another point in the feedback loop such as to the divider 202 or to an input buffer of the LO module 200.

In the LO module 200, the instructions 282, the digital adjustment signal 284, the analog voltage signal 288, and the control signals CS1, CS2, CS3, and CS4 each represent, in different signal forms, the pulse width adjustment determined by the processor 212. Hence, any one of these signals (or other intermediary signals, not shown) may be used to provide feedback to adjust the duty cycle of the Rx LO signal 142. Generally, these signals are represented in a digital form (e.g., instructions 282, the digital adjustment signal 284) or in an analog form (e.g., analog voltage signal 288, and the control signals CS1, CS2, CS3, and CS4). In the example shown in FIG. 2, as well as in FIG. 3, the feedback signal is converted from a digital form to an analog form for application to the LO buffer 204. In another example, which may be employed in FIG. 2, as well as FIG. 3, the feedback signal may remain in digital form for application to the LO buffer 204. In this case, the DAC 218 is eliminated because the analog voltage signal 288 is no longer needed, and the control devices 221, 223, 225, and 227 are adapted to receive a digital signal, rather than an analog signal. For example, the control devices 221, 223, 225, and 227 may be a binary weighted control device, otherwise called a binary bank, having six (6) bits (e.g., 1×, 2×, 4×, 8×, 16×, and 32×). The number of bits in the control device determines the resolution of the control signals CS1, CS2, CS3, and CS4 in response to the received digital signal. The resolution corresponds to the fine tuning the duty cycle of the Rx LO signal (i.e., relatively small or large adjustments) during the feedback process.

As described herein above, the low pass filters 206 provides the VCM signal 276, representing an average of the four LO output signals 264, 266, 268, and 270, and the resistor ladder network 208 provides the local reference voltage supply 274, representing a portion of the local voltage supply 272. The feedback control loop in the LO module 200 in FIG. 1 is relatively simple in that one average signal 276 is compared to the relatively accurate signal 274, and the control signals CS1, CS2, CS3, and CS4 adjust the pulse width of each of the four LO output signals 264, 266, 268, and 270, respectively.

Considering that the average signal 276 is compared to the relatively accurate signal 274 to generate the control signals CS1, CS2, CS3, and CS4 to adjust the pulse width of each of the four LO output signals 264, 266, 268, and 270, respectively, such a feedback control loop, although simplified, may not be accurate for each of the four LO output signals 264, 266, 268, and 270. For example, one of the four LO output signals 264, 266, 268, and 270 might have been higher than, lower than, or the same as the average voltage level of the VCM signal 276. In this case, the one analog voltage signal 288 for each of the control signals CS1, CS2, CS3, and CS4 may adjust the pulse width of the four LO output signals 264, 266, 268, and 270, respectively, too much or too little. Although the simplified design, shown in FIG. 2, may be acceptable for some or most designs, some designs may require or advantageously employ individual adjustment of the pulse width of each of the four LO output signals 264, 266, 268, and 270.

Figure 3:
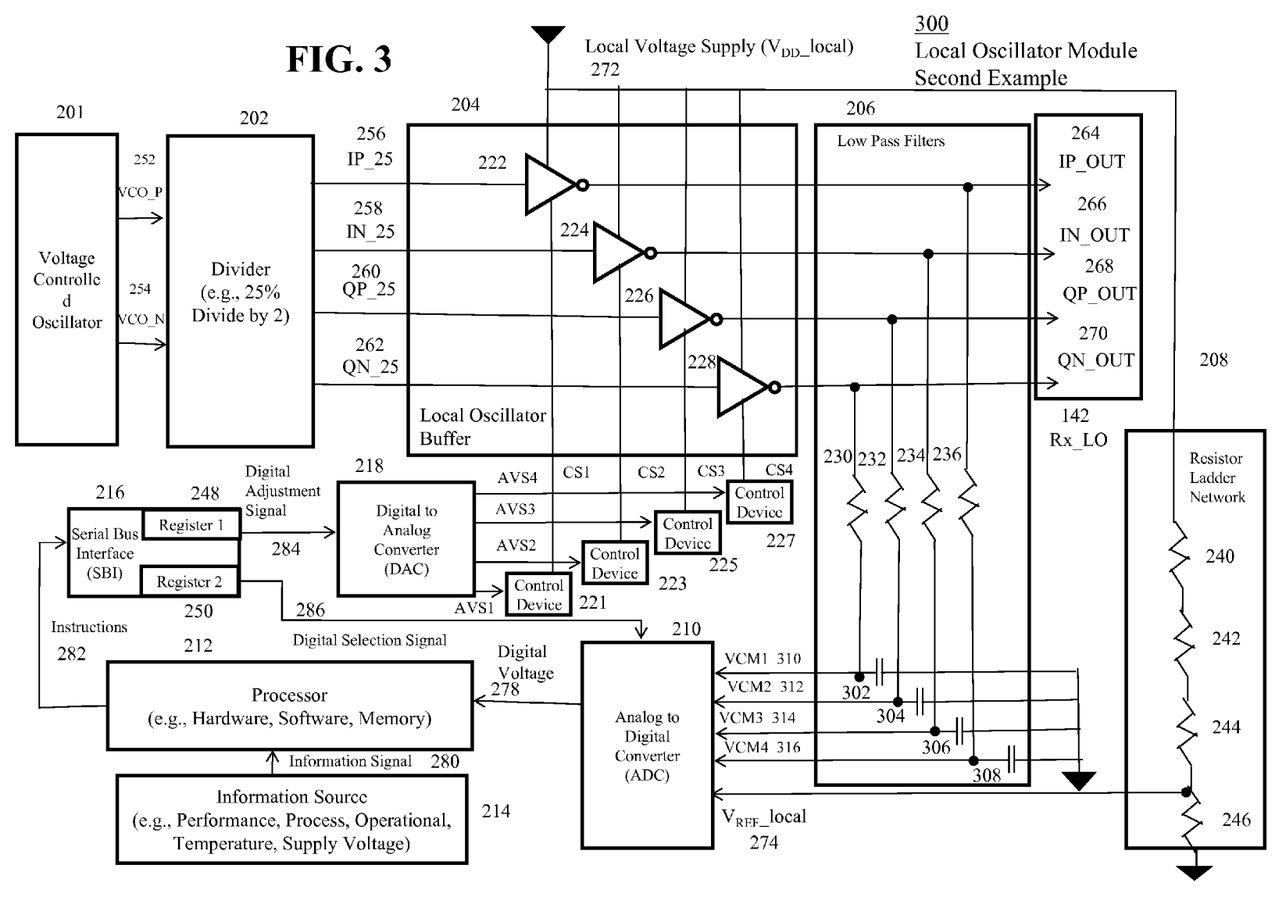
FIG. 3 illustrates a second example of a block diagram representation of a local oscillator (LO) module which may be used in the RF transceiver, shown in FIG. 1, according to one aspect of the present invention.

Such an individual adjustment of the pulse width of each of the four LO output signals 264, 266, 268, and 270 is shown in FIG. 3, illustrated as a second example of a block diagram representation of a local oscillator (LO) module 300, which may be used in the RF transceiver, shown in FIG. 1, according to one aspect of the present invention.

A primary difference between the LO module 300, shown in FIG. 3, and the LO module 200, shown in FIG. 2, is that the low pass filters 206 in FIG. 3 now include four separate low pass filters providing four separate average voltage level measurements of the four LO output signals. For example, the low pass filters 206 now include resistors 230, 232, 234, and 236 used in combination with capacitor 302, 304, 306, and 308, respectively, to provide four separate low pass filters, as are individually well known to those skilled in the art of filter design. The low pass filter represented by resistor 230 and capacitor 302 determines a first average voltage level of the buffer output signal, represented by QN_OUT 270. The low pass filter represented by resistor 232 and capacitor 304 determines a second average voltage level of the buffer output signal, represented by QP_OUT 268. The low pass filter represented by resistor 234 and capacitor 306 determines a third average voltage level of the buffer output signal, represented by IN_OUT 266. The low pass filter represented by resistor 236 and capacitor 308 determines a fourth average voltage level of the buffer output signal, represented by IP_OUT 264.

The four outputs of the low pass filters 206 are common mode voltage (VCM) signals 310, 312, 314, and 316, representing the first, second, third and fourth average voltage levels, respectively, of the four respective LO output signals 264, 266, 268, and 270. Other circuits or methods for determining the four individual average voltage level of the LO output signals may be used instead of the four individual low pass filters 206.

Secondary differences between the LO module 300, shown in FIG. 3, and the LO module 200, shown in FIG. 2, not shown in detail in FIG. 3, include the ADC 210, the processor 212, the SBI 216, the DAC 218, and the control devices 221, 223, 225, and 227 being able to accommodate the four VCM signals 310, 312, 314, and 316 to produce four separate analog voltage signals AVS4, AVS3, AVS2, and AVS1, respectively.

The general process in FIG. 3 is similar to that as described in FIG. 2 in that the processor compares each of the four VCM signal to the one local reference supply voltage signal 274 to determine a voltage difference signal for each of the four VCM signals to thereby determine a corresponding pulse width adjustment for each of the corresponding four LO output signals 264, 266, 268, and 270.

The DAC 218 (e.g., four DACs or one DAC plus four delta DACs) generates four analog voltage signals (AVS1-AVS4) for four control devices 221, 223, 225, and 227, respectively, to provide four separate and independent control signals (CS1-CS4), respectively, to the four LO buffers 222, 224, 226, 228, respectively. Individual control of the four LO buffers 222, 224, 226, 228 permit individual control of the four corresponding LO output signals 264, 266, 268, and 270. Individual control of the four corresponding LO output signals 264, 266, 268, and 270 permits individual control of the pulse width of each of the four corresponding LO output signals 264, 266, 268, and 270 to adjust the duty cycle of each of the four corresponding LO output signals 264, 266, 268, and 270. In other words, one LO signal might have its pulse width adjusted up and another LO signal might have its pulse width adjusted down or not at all.

One example of when independent LO signal pulse width adjustment may be advantageous involves calibration of the second intercept point (IP2) of the receiver module 104, shown in FIG. 1. IP2 performance in the receiver module 104 is typically strongly dependent on (i.e., degrades due to) skews or imbalances in the duty cycle of I and Q differential LO output signals. The ability to independently adjust the pulse widths of the LO output signals 264, 266, 268, and 270 advantageously permits elimination or reduction of conventional IP2 calibration performed by adjusting mixer bias voltage in the frequency down-conversion module 118, shown in FIG. 1, using time consuming test equipment external to the RF transceiver 100, and perform IP2 calibration "on the fly" (i.e., real time, periodically, etc., as explained herein) on an RFIC or in a mobile station, for example. Such adjustment may be performed in an engineering lab, during RFIC manufacturing or production, after installation into a final product (e.g., a mobile station), after a final product is sold in the field, or during use of a final product, etc. In other words, independent adjustment of the pulse widths of the LO output signals 264, 266, 268, and 270 advantageously permits IP2 calibration during the operation of the receiver module 104.

As described with reference to FIG. 2, the control signals CS1, CS2, CS3, and CS4 may be in analog form, as shown in FIGS. 2 and 3, or in digital form. For a digital implementation in FIG. 3, the DAC 218 is eliminated and the control devices 221, 223, 225, and 227 are adapted to receive digital signals, as describe for FIG. 2. Thus, in FIG. 3, the four digital adjustment signals 284 (shown collectively rather than individually), would be applied to the four control devices 221, 223, 225, and 227, respectively, to provide digital and independent control of the current through each of the LO buffers 222, 224, 226, and 228, respectively, to provide individual control of the duty cycle of each of the LO signals 264, 266, 268, and 270, respectively.

In each of the LO modules 200 and 300, the adjustment of the duty cycle of the LO output signal is an absolute adjustment, as opposed to a relative adjustment. In other words, the duty cycle of the LO output signal may be adjusted to any particular or desired value, and not just adjusted to reduce a phase difference to minimize an error. Such an absolute duty cycle adjustment advantageously permits the duty cycle to be adjusted based on different, various, and particular circumstances.

Figure 4:
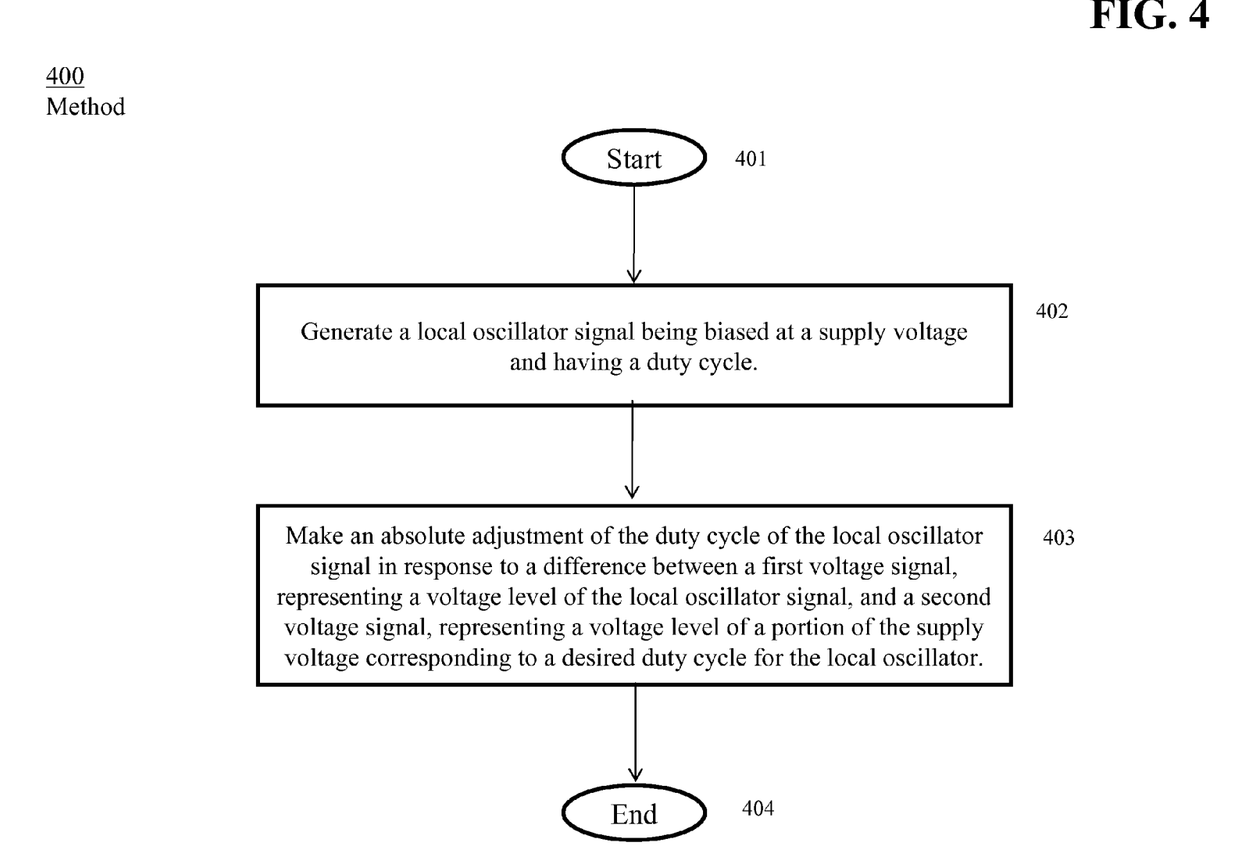
FIG. 4 illustrates a method for adjusting a pulse width of a local oscillator signal which may be used with the first or second local oscillator (LO) modules, shown in FIG. 2 or 3, respectively, according to one aspect of the present invention.

FIG. 4 illustrates a method 400 for adjusting a pulse width of a local oscillator signal 142 which may be used with the first 200 or second 300 local oscillator (LO) modules, shown in FIG. 2 or 3, respectively, according to one aspect of the present invention. High level steps of the method 400 are illustrated in FIG. 4 for the sake of additional clarity. Additional steps and further details of the method 400 are explicitly or implicitly described with reference to FIGS. 2 and 3 and the associated description.

At block 401, the method 400 starts.

At block 402, the method 400 generates a local oscillator signal 264, 266, 268, and 270 being biased at a supply voltage 272 and having a duty cycle.

At block 403, the method 400 makes an absolute adjustment of the duty cycle of the local oscillator signal 264, 266, 268, and 270 in response to a difference between a first voltage signal 276 (or 310, 312, 314, and 316), representing a voltage level of the local oscillator signal 264, 266, 268, and 270, and a second voltage signal 274, representing a voltage level of a portion of the supply voltage 272 corresponding to a desired duty cycle for the local oscillator 200 (or 300).

At block 404, the method 400 ends.

In summary, some of the advantages of the first 200 and second 300 examples of the LO module include the following. The LO modules 200 and 300 maintain accurate control over the duty cycle of four LO output signals 264, 266, 268, and 270 over non-ideal conditions, such as integrated circuit process, voltage supply level and temperature variations. The LO modules 200 and 300 permit optimum choice of the duty cycle of four LO output signals 264, 266, 268, and 270 (e.g., around 25%) to achieve a desired balance between noise figure and linearity performance parameters in the receiver module 104. The LO modules 200 and 300 employs built-in-self-test (BIST) features of the RF transceiver design (e.g., on an integrated circuit (IC) chip), which do not require time consuming test equipment or methods external to the IC chip. The BIST permits calibration to be done "on the fly." Since the LO modules 200 and 300 each use a "sense and adjust" closed loop operation, the LO modules 200 and 300 may continuously monitor and adjust the duty cycle of the LO output signals 264, 266, 268, and 270.

Although aspects of the present invention have been described for the LO modules 200 and 300 for application to the receiver module 104 at the frequency down-conversion module 118, they may also be employed with the transmitter module 106 to control the frequency up-conversion module 136, for example.

Alternative Implementations

The system, elements, modules, methods, and/or processes contained herein may be implemented in hardware, software, or a combination of both, and may include one or more processors. A processor is a device and/or set of machine-readable instructions for performing task. A processor may be any device, capable of executing a series of instructions embodying a process, including but not limited to a computer, a microprocessor, a controller, an application specific integrated circuit (ASIC), finite state machine, digital signal processor (DSP), or some other mechanism. The processor includes any combination of hardware, firmware, and/or software. The processor acts upon stored and/or received information by computing, manipulating, analyzing, modifying, converting, or transmitting information for use by an executable application or procedure or an information device, and/or by routing the information to an output device.

An executable application comprises machine code or machine readable instruction for implementing predetermined functions including, for example, those of an operating system, a software application program, or other information processing system, for example, in response user command or input.

An executable procedure is a segment of code (i.e., machine readable instruction), sub-routine, or other distinct section of code or portion of an executable application for performing one or more particular processes, and may include performing operations on received input parameters (or in response to received input parameters) and providing resulting output parameters.

In various embodiments, hardwired circuitry may be used in combination with software instructions to implement the present invention. Thus, the techniques are not limited to any specific combination of hardware circuitry and software, or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor.

It will be apparent from this description that aspects of the present invention may be embodied, at least in part, in software. That is, the techniques may be carried out in a computer system or other data processing system in response to its processor executing sequences of instructions contained in a machine-readable medium.

A machine-readable medium includes any mechanism that provides (i.e., stores and/or transmits) information in a form accessible by a machine (e.g., a computer, network device, personal digital assistant, computer, data processor, manufacturing tool, any device with a set of one or more processors, etc.). A machine-readable medium can be used to store software and data which, when executed by a data processing system, causes the system to perform various methods of the present invention. Portions of this executable software and/or data may be stored in various places. For example, a machine-readable medium includes recordable/non-recordable media (e.g., read only memory (ROM), random access memory (RAM), magnetic disk storage media, optical storage media, flash memory devices, non-volatile memory, cache, remote storage device, etc.), as well as electrical, optical, acoustical or other forms of propagated signals (e.g., carrier waves, infrared signals, digital signals, etc.), etc.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A local oscillator (LO) module comprising:
   a local oscillator, biased at a supply voltage, for generating a local oscillator signal having a duty cycle; and
   a feedback circuit for making an absolute adjustment of the duty cycle of the local oscillator signal in response to a difference between a first voltage signal, representing a voltage level of the local oscillator signal, and a second voltage signal, representing a voltage level of a portion of the supply voltage corresponding to a desired duty cycle for the local oscillator signal, wherein the feedback circuit comprises:
   first means for determining the first voltage signal;
   second means for determining the second voltage signal;
   third means for receiving the first and second voltage signals;
   fourth means for comparing the first and second voltage signals in response to receiving the first and second voltage signals;
   fifth means for determining a difference between the first and second voltage signals in response to comparing the first and second voltage signals;
   sixth means for determining an adjustment signal in response to determining the difference between the first and second voltage signals; and
   seventh means for generating a control signal in response determining the adjustment signal.

2. The LO module of claim 1, wherein the first means comprises:
   a low pass filter.

3. The LO module of claim 1, wherein the second means comprises:
   a resistor divider network.

4. The LO module of claim 1, wherein the third means, fourth means, fifth means, and sixth means comprises:
   a processor.

5. The LO module of claim 1, wherein the seventh means comprises:
   a control device.

6. The LO module of claim 1, wherein the feedback circuit comprises:
   an analog to digital converter for converting each of the first voltage signal and the second voltage signal from an analog signal format to a digital signal format to generate a first digital signal and a second digital signal, respectively.

7. The LO module of claim 1, wherein the feedback circuit comprises:
   a digital to analog converter for converting the adjustment signal from a digital format to an analog format to generate an analog voltage signal.

8. A local oscillator (LO) module comprising:
   a voltage controlled oscillator (VCO) for generating a VCO signal;
   a divider for dividing the VCO signal to generate a divided signal;
   a local oscillator buffer, biased at a supply voltage, for buffering the divided signal to generate a buffered signal, representing a local oscillator signal, in response to receiving a control signal;
   a low pass filter for determining a first voltage signal, representing a voltage level of the local oscillator signal;
   a resistor divider network for determining a second voltage signal, representing a voltage level of a portion of the supply voltage corresponding to a desired duty cycle of the local oscillator signal;
   an analog to digital converter for converting each of the first voltage signal and the second voltage signal from an analog signal format to a digital signal format to generate a first digital signal and a second digital signal, respectively;
   an information source for providing information that affects a duty cycle of the local oscillator signal,
   a processor for receiving the first digital signal and the second digital signal, for comparing the first digital signal and the second digital signal, for determining a difference between the first digital signal and the second digital signal, and determining an adjustment signal in response to determining the difference and in response to receiving the information; and
   a control device for generating the control signal in response to receiving the adjustment signal to adjust the duty cycle of the local oscillator signal.

9. The LO module of claim 8, comprising:
   a digital to analog converter for converting the adjustment signal from a digital format to an analog format to generate an analog voltage signal,
   wherein the control device generates the control signal in response to receiving the analog voltage signal.

10. A method comprising:
    generating a local oscillator signal being biased at a supply voltage and having a duty cycle;
    making an absolute adjustment of the duty cycle of the local oscillator signal in response to a difference between a first voltage signal, representing a voltage level of the local oscillator signal, and a second voltage signal, representing a voltage level of a portion of the supply voltage corresponding to a desired duty cycle for the local oscillator,
    wherein making the absolute adjustment of the duty cycle of the local oscillator signal comprises:
    determining the first voltage signal;
    determining the second voltage signal;
    receiving the first and second voltage signals;
    comparing the first and second voltage signals in response to receiving the first and second voltage signals;
    determining a difference between the first and second voltage signals in response to comparing the first and second voltage signals;
    determining an adjustment signal in response to determining the difference between the first and second voltage signals; and
    generating a control signal in response determining the adjustment signal.

11. The method of claim 10, comprising:
    converting each of the first voltage signal and the second voltage signal from an analog signal format to a digital signal format to generate a first digital signal and a second digital signal, respectively.

12. The method of claim 10, comprising:
converting the adjustment signal from a digital format to an analog format to generate an analog voltage signal.

13. An apparatus comprising:
means for generating a local oscillator signal being biased at a supply voltage and having a duty cycle;
means for making an absolute adjustment of the duty cycle of the local oscillator signal in response to a difference between a first voltage signal, representing a voltage level of the local oscillator signal, and a second voltage signal, representing a voltage level of a portion of the supply voltage corresponding to a desired duty cycle for the local oscillator,
wherein the means for making the absolute adjustment of the duty cycle of the local oscillator signal comprises:
means for determining the first voltage signal;
means for determining the second voltage signal;
means for receiving the first and second voltage signals;
means for comparing the first and second voltage signals in response to receiving the first and second voltage signals;
means for determining a difference between the first and second voltage signals in response to comparing the first and second voltage signals;
means for determining an adjustment signal in response to determining the difference between the first and second voltage signals; and
means for generating a control signal in response determining the adjustment signal.

\* \* \* \* \*